United States Patent
Oh et al.

(10) Patent No.: US 11,537,842 B2
(45) Date of Patent: Dec. 27, 2022

(54) STORAGE DEVICE INFERRING READ LEVELS BASED ON ARTIFICIAL NEURAL NETWORK MODEL AND LEARNING METHOD OF ARTIFICIAL NEURAL NETWORK MODEL

(71) Applicant: Samsung Electronics Co., Ltd., Suwon-si (KR)

(72) Inventors: Hyunkyo Oh, Yongin-si (KR); Youngdeok Seo, Seoul (KR); Jinbaek Song, Hwaseong-si (KR); Sanghyun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 859 days.

(21) Appl. No.: 16/448,636

(22) Filed: Jun. 21, 2019

(65) Prior Publication Data
US 2020/0151539 A1 May 14, 2020

(30) Foreign Application Priority Data
Nov. 14, 2018 (KR) .......................... 10-2018-0139727

(51) Int. Cl.
*G06N 3/04* (2006.01)
*G06N 5/04* (2006.01)
*G11C 16/26* (2006.01)
*G11C 16/04* (2006.01)

(52) U.S. Cl.
CPC .................. *G06N 3/04* (2013.01); *G06N 5/04* (2013.01); *G11C 16/0483* (2013.01); *G11C 16/26* (2013.01)

(58) Field of Classification Search
CPC ........ G06N 3/04; G06N 5/04; G11C 16/0483; G11C 16/26
See application file for complete search history.

(56) References Cited

U.S. PATENT DOCUMENTS

| | | | |
|---|---|---|---|
| 7,679,133 | B2 | 3/2010 | Son et al. |
| 8,369,141 | B2 | 2/2013 | Sommer et al. |
| 8,553,466 | B2 | 10/2013 | Han et al. |

(Continued)

FOREIGN PATENT DOCUMENTS

CN         111052215 A   *   4/2020   ............... G09G 3/32

OTHER PUBLICATIONS

Translation of CN-111052215-A (filed Aug. 10, 2018) (Year: 2020).*

*Primary Examiner* — Henry Tsai
*Assistant Examiner* — John B Roche
(74) *Attorney, Agent, or Firm* — Harness, Dickey & Pierce, P.L.C.

(57) ABSTRACT

A storage device includes a non-volatile memory including a plurality of blocks, a buffer memory that stores a plurality of on-cell counts, which are generated by reading memory cells connected to a plurality of reference word lines of the plurality of blocks by using a read level, and an artificial neural network model, and a controller that inputs an on-cell count corresponding to a target block among the plurality of on-cell counts and a number of a target word line of the target block to the artificial neural network model, and infers a plurality of read levels for reading data of memory cells connected to the target word line using the artificial neural network model.

20 Claims, 14 Drawing Sheets

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 9,111,626 B2 | 8/2015 | Kim et al. | |
| 9,508,423 B2 | 11/2016 | Kim | |
| 9,916,237 B2 | 3/2018 | Hyun et al. | |
| 10,013,211 B2 | 7/2018 | Lee et al. | |
| 2011/0233648 A1 | 9/2011 | Seol et al. | |
| 2017/0206979 A1 | 7/2017 | Cohen et al. | |
| 2017/0229186 A1 | 8/2017 | Karakulak et al. | |
| 2017/0358346 A1 | 12/2017 | Zhang et al. | |
| 2018/0048434 A1 | 2/2018 | Kumar et al. | |
| 2018/0108422 A1 | 4/2018 | Oh et al. | |
| 2020/0151539 A1* | 5/2020 | Oh | G06N 3/08 |

* cited by examiner

FIG. 7

Block Data

| Input features | | | Labels |
|---|---|---|---|
| OCC1 (Ref WL) | OCC2 (Ref WL) | WL4 (Ref WL) | Read Level Set of WL4 |
| OCC1 (Ref WL) | OCC2 (Ref WL) | WL5 | Read Level Set of WL5 |
| OCC1 (Ref WL) | OCC2 (Ref WL) | WL6 | Read Level Set of WL6 |
| ⋮ | ⋮ | ⋮ | ⋮ |
| OCC1 (Ref WL) | OCC2 (Ref WL) | WL64 | Read Level Set of WL64 |

↑ (Read Level 1) ↑ (Read Level 2) ↑ (Target WL #)

STORAGE DEVICE INFERRING READ LEVELS BASED ON ARTIFICIAL NEURAL NETWORK MODEL AND LEARNING METHOD OF ARTIFICIAL NEURAL NETWORK MODEL

CROSS-REFERENCE TO RELATED APPLICATIONS

This application claims priority under 35 U.S.C. § 119 to Korean Patent Application No. 10-2018-0139727 filed on Nov. 14, 2018, in the Korean Intellectual Property Office, the disclosure of which is incorporated by reference herein in its entirety.

BACKGROUND

Example embodiments of the inventive concepts described herein relate to a storage device that infers read levels based on an artificial neural network model and a learning method of the artificial neural network model.

A storage device may include a non-volatile memory. As a capacity of a storage device increases, nowadays, the number of memory cells stacked on a substrate of a non-volatile memory and the number of word lines stacked thereon increase, and the number of bits of data stored in a memory cell increases.

The non-volatile memory deteriorates over time due to various factors depending on a usage pattern of a user, a usage environment, etc. For example, a controller of the storage device may read data stored in memory cells connected to a target word line by using initially set read voltages, and may determine whether an uncorrectable error is present in the read data. A storage device may cope with deterioration by changing an operating condition of the non-volatile memory. In a case where the read data includes an uncorrectable error, the controller may change the initially set read voltages to have levels determined in advance, and may then read data stored in the memory cells connected to the target word line by using read voltages of the changed levels determined in advance instead of the initially set read voltages. The changed operating condition may be set in advance to the storage device only with respect to an average usage pattern and a typical usage environment. However, this manner of coping with deterioration is not appropriate to overcome an issue in which a shift of a threshold voltage distribution of memory cells varies for each word line. Because memory cells may deteriorate by different amounts and/or rates over time based on an actual usage pattern and actual usage environment, the levels determined in advance may not be optimum values capable of coping with various deterioration. Accordingly, an improved storage device and operating method for preventing (or reducing) damage or loss of data due to deterioration of the non-volatile memory is desired.

SUMMARY

Example embodiments of the inventive concepts provide a storage device that infers read levels based on an artificial neural network model and a learning method of the artificial neural network model.

According to some example embodiments, a storage device includes a non-volatile memory including a plurality of blocks, a buffer memory that stores a plurality of on-cell counts, which are generated by reading memory cells connected to a plurality of reference word lines of the plurality of blocks by using a read level, and an artificial neural network model, and a controller that inputs an on-cell count corresponding to a target block among the plurality of on-cell counts and a number of a target word line of the target block to the artificial neural network model, and infers a plurality of read levels for reading data of memory cells connected to the target word line using the artificial neural network model.

According to some example embodiments, a storage device includes a non-volatile memory including a plurality of blocks, a buffer memory that stores an artificial neural network model, and a controller that controls the non-volatile memory and the buffer memory. The controller reads memory cells connected to reference word lines of the plurality of blocks by using first and second read levels for acquiring a plurality of first and second on-cell counts of the plurality of blocks, stores the plurality of first and second on-cell counts of the plurality of blocks in the buffer memory, inputs first and second on-cell counts corresponding to a target block among the plurality of first and second on-cell counts and a number of a target word line of the target block to the artificial neural network model, and infers a plurality of read levels for reading data of memory cells connected to the target word line using the artificial neural network model.

According to some example embodiments, a method of learning read levels to be applied to word lines of each of a plurality of blocks in a non-volatile memory of a storage device by using an artificial neural network model includes reading a reference word line of each of the plurality of blocks by using a read level to acquire an on-cell count of each of the plurality of blocks, calculating a plurality of read levels for reading data of memory cells connected to a plurality of word lines of each of the plurality of blocks, providing the artificial neural network model with training data, which include input data including the on-cell count of each of the plurality of blocks and numbers of the plurality of word lines and output data including the plurality of read levels, and calibrating weights and biases of the artificial neural network model such that the artificial neural network model generates the output data from the input data.

BRIEF DESCRIPTION OF THE FIGURES

FIG. 7 illustrates block data of training data of FIG. 6.

DETAILED DESCRIPTION

Below, example embodiments of the inventive concepts will be described in detail and clearly to such an extent that one of ordinary skill in the art may implement the inventive concepts.

Figure 1:
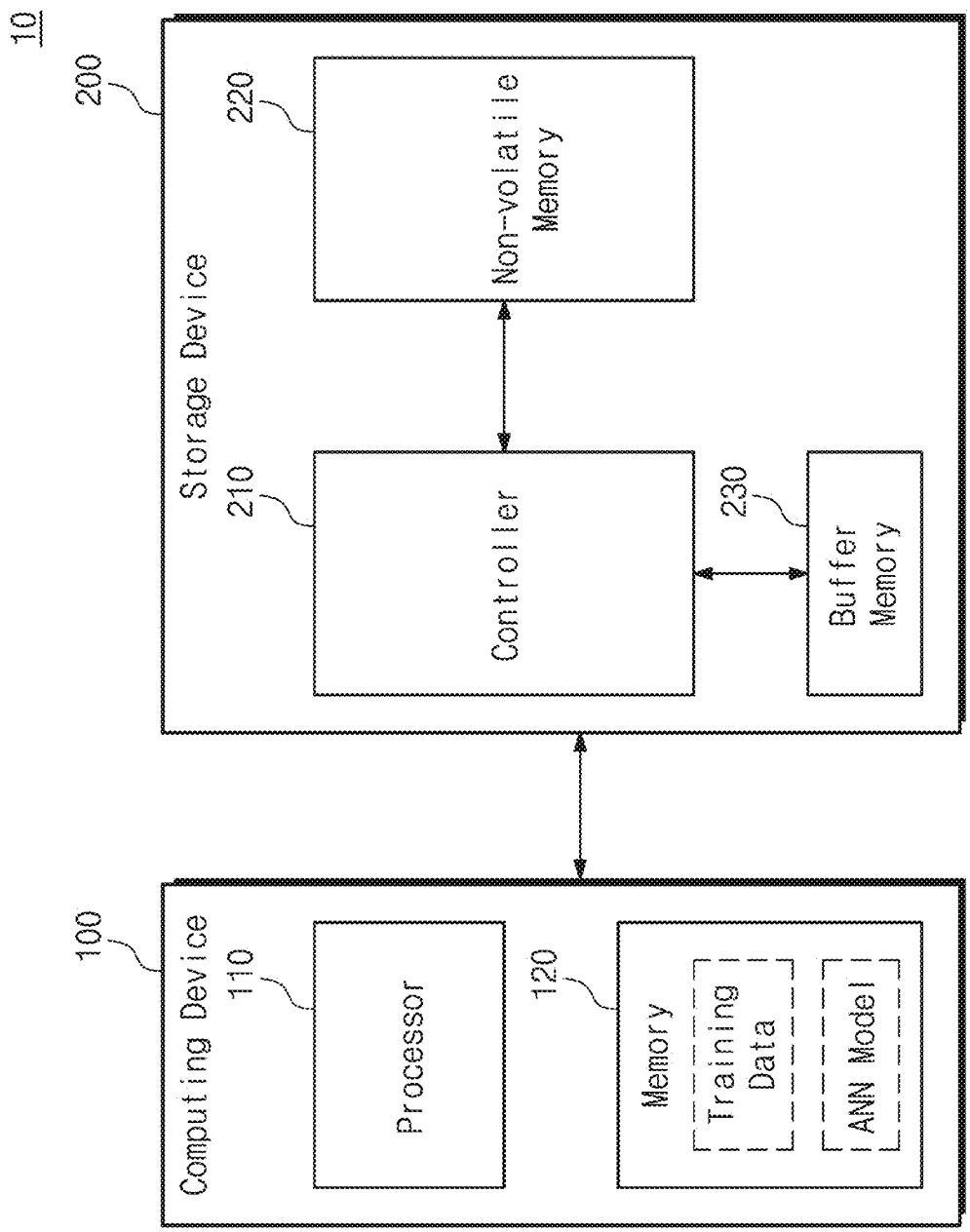
FIG. 1 illustrates a block diagram of a memory system according to some example embodiments of the inventive concepts.

FIG. 1 illustrates a block diagram of a memory system according to some example embodiments of the inventive concepts. A memory system 10 may include a computing device 100 and a storage device 200.

The computing device 100 (or an electronic device) may communicate with the storage device 200. The computing device 100 may allow an artificial neural network model (ANN model), which is mounted on the storage device 200 and is executed by the storage device 200, to learn. The computing device 100 may configure training data for the learning of the artificial neural network model. For example, the computing device 100 may be a deep learning server, which is specialized to execute or implement the artificial neural network model. The computing device 100 may include a processor 110 and a memory 120.

The processor 110 may execute the artificial neural network model stored in the memory 120 to learn the artificial neural network model. For example, the processor 110 may include a central processing unit (CPU), a graphics processing unit (GPU), a neural processing unit (NPU), a digital signal processor (DSP), etc., and the number of processors 110 may be at least "2" (e.g., a multi-core processor) in some example embodiments.

The memory 120 may be a storage medium (e.g., a tangible, non-transitory computer readable storage medium) which may store the artificial neural network model and training data. The artificial neural network model may be implemented in the form of a program code which is executed by the processor 110. The training data may include input data which are input to the artificial neural network model and output data which should be output from the artificial neural network model. The memory 120 may include a volatile memory or a non-volatile memory. For example, the memory 120 may include a dynamic random access memory (DRAM), a static random access memory (SRAM), a NAND flash memory, a NOR flash memory, a resistive random access memory (RRAM), a ferroelectric random access memory (FRAM), a phase change random access memory (PRAM), a magnetic random access memory (MRAM), etc.

The storage device 200 may include a controller 210, a non-volatile memory 220, and a buffer memory 230. For example, the storage device 200 may be a solid state drive (SSD), a memory card, a micro SD card, an embedded multi-media card (eMMC), universal flash storage (UFS), etc., but example embodiments are not limited thereto.

The controller 210 may process a request of the computing device 100. The controller 210 may perform a write operation, a read operation, and/or an erase operation on the non-volatile memory 220 in response to the request of the computing device 100. The controller 210 may control the non-volatile memory 220 and the buffer memory 230. The controller 210 may be implemented with a system on chip (SoC), an application specific integrated circuit (ASIC), a field programmable gate array (FPGA), etc.

The non-volatile memory 220 may perform the write operation, the read operation, and/or the erase operation under control of the controller 210. In some example embodiments, as illustrated in FIG. 1, the number of non-volatile memories 220 is "1", but the number of non-volatile memories 220 may be greater than "1" in some other example embodiments. The non-volatile memory 220 may receive a write command, an address, and data from the controller 210 and may write the data in memory cells corresponding to the address according to the write command. The non-volatile memory 220 may receive a read command and an address from the controller 210, may read data from memory cells corresponding to the address, and may output the read data to the controller 210 according to the read command. The non-volatile memory 220 may receive an erase command and an address from the controller 210 and may erase data of memory cells corresponding to the address according to the erase command.

The non-volatile memory 220 may include a plurality of memory cells. For example, a memory cell may be a NAND flash memory cell, a NOR flash memory cell, an RRAM cell, an FRAM cell, a PRAM cell, an MRAM cell, etc. The memory cells may be divided into blocks (not illustrated). Memory cells included in each of the blocks may correspond to a unit by which data are erased. The non-volatile memory 220 will be described in FIG. 2 in detail.

The buffer memory 230 may include a DRAM, an SRAM, or a tightly coupled memory (TCM). Regardless of the illustration of FIG. 1, the buffer memory 230 may be implemented inside or outside the controller 210. A capacity of the buffer memory 230 may be smaller than a capacity of the non-volatile memory 220, but the buffer memory 230 may have a latency (waiting time or delay), an access time, and an operating speed that are improved as compared with the non-volatile memory 220. For example, information or a program for controlling or managing the non-volatile memory 220, a mapping table indicating a relationship between a logical address of the host and a physical address of the non-volatile memory 220, data to be stored in the non-volatile memory 220, data output from the non-volatile memory 220, etc. may be stored in the buffer memory 230. The data and/or information stored in the buffer memory 230 may be backed up to the non-volatile memory 220 by the controller 210.

Figure 2:
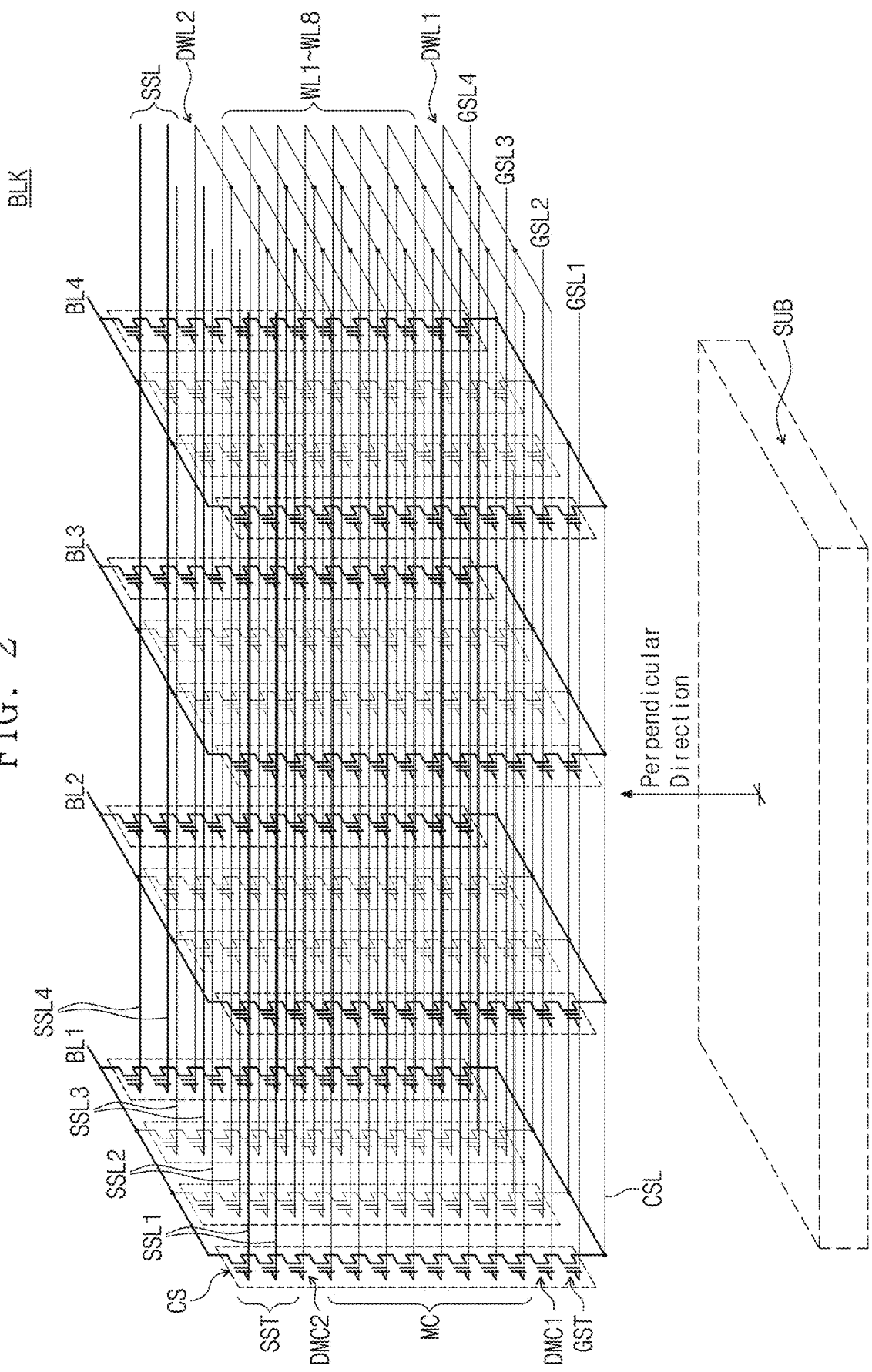
FIG. 2 illustrates a block of a non-volatile memory device of FIG. 1 in detail.

FIG. 2 illustrates a block of a non-volatile memory device of FIG. 1 in detail. A block BLK of FIG. 2 may be one of a plurality of blocks of the non-volatile memory 220. A plurality of cell strings CS may be arranged on a substrate SUB. The plurality of cell strings CS may be connected in common to a common source line CSL formed on (or in) the substrate SUB. A location of the substrate SUB is exemplified to help understand a structure of the block BLK. In some example embodiments, the common source line CSL is connected to lower ends of the cell strings CS. However, it is sufficient that the common source line CSL is electrically connected to the lower ends of the cell strings CS, and some other example embodiments are not limited to the case that the common source line CSL is physically located at the lower ends of the cell strings CS. In some example embodiments, the cell strings CS are arranged in a four-by-four matrix. However, the number of cell strings CS in the block BLK may increase or decrease in some other example embodiments.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string CS may include at least one ground selection transistor GST connected to a corresponding ground selection line (one of GSL1 to GSL4), a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL (one of SSL1 to SSL4). In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along the direction perpendicular to the substrate SUB. Numbers "1" to "8" of the word lines WL1 to WL8 may indicate distances between the word lines WL1 to WL8 and the substrate SUB or locations of the word lines WL1 to WL8, in a perpendicular direction. For example, a number may be also referred to as an "address".

In some example embodiments, as illustrated in FIG. 2, one or more dummy memory cells (e.g., DMC1) may be arranged between the ground selection transistor GST and the memory cells MC in each cell string CS. In each cell string CS, one or more dummy memory cells (e.g., DMC2) may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. In some example embodiments, as shown in FIG. 2, memory cells of the same height (or order) are connected to the same word line (one of WL1 to WL8). However, the memory cells of the same height (or order) may be directly connected to each other in a plane where the memory cells are formed or may be indirectly connected to each other through another layer such as a metal layer in some other example embodiments.

Memory cells which correspond to a string selection line (or ground selection line) and a word line may configure a page. A write operation and/or a read operation may be performed by the page. In each page, each memory cell may store two or more bits. Bits that are written in memory cells belonging to one page may form logical pages. For example, k-th bits that are respectively written in memory cells of each page may form a k-th logical page.

The block BLK may be provided at a three-dimensional (3D) memory array. The 3D memory array is monolithically formed in one or more physical levels of arrays of memory cells MC having an active area disposed above a silicon substrate SUB and a circuitry associated with the operation of those memory cells MC. The circuit associated with an operation of memory cells MC may be located above or within such substrate SUB. The term "monolithic" means that layers of each level of the array are directly deposited on the layers of each underlying level of the 3D memory array.

In some example embodiments, the 3D memory array includes vertical cell strings CS (or NAND strings) that are vertically oriented so that at least one memory cell is located over another memory cell. The at least one memory cell may comprise a charge trap layer. Each cell string may further include at least one string selection transistor SST placed over the memory cells MC. The at least one string selection transistor SST may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
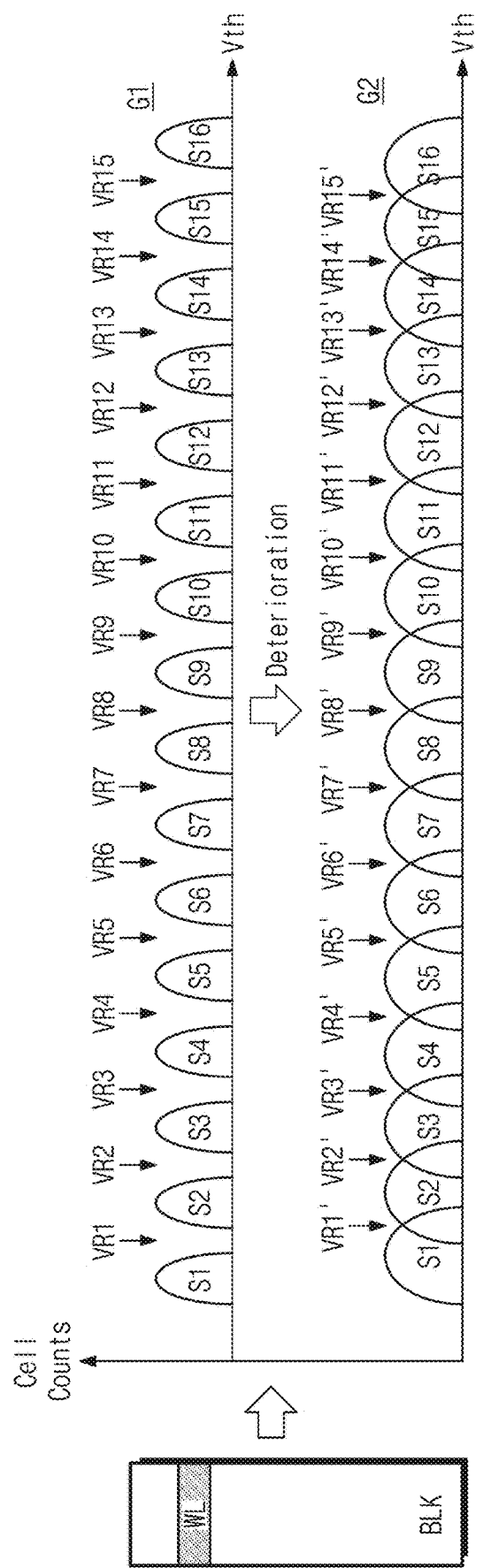
FIG. 3 illustrates graphs indicating distributions of threshold voltages of memory cells of FIG. 2, which are shifted due to deterioration.

FIG. 3 illustrates graphs indicating distributions of threshold voltages of memory cells of FIG. 2, which are shifted due to deterioration. Graphs G1 and G2 illustrate distributions of threshold voltages of memory cells connected to a word line WL. In FIG. 3, a horizontal axis represents threshold voltages of memory cells, and a vertical axis represents cell counts, that is, the number of memory cells.

The word line WL of FIG. 3 may be included in one block of the non-volatile memory 220 described with reference to FIGS. 1 and 2. One or more bits may be programmed in each of the memory cells connected to the word line WL. A memory cell may be classified as a single level cell (SLC), a multi-level cell (MLC), a triple level cell (TLC), or a quad level cell (QLC), for example, depending on the number of bits stored in the memory cell. The memory cell may have one of a plurality of states depending on the number of bits stored in the memory cell. Each of the plurality of states may be defined as a range of a threshold voltage. In FIG. 3, it is assumed that a memory cell is the QLC and a threshold voltage of the memory cell may be programmed to one of 16 states S1 to S16.

After data are written in the memory cell, disturb deterioration and/or retention deterioration may occur at the memory cell. The disturb deterioration refers to a phenomenon in which threshold voltages of memory cells vary with programming, reading, erasing, coupling, etc. generated around the memory cells. The retention deterioration refers a phenomenon in which threshold voltages of memory cells vary as charges trapped in charge trap layers of the memory cells are discharged over time. Since a threshold voltage of a memory cell is shifted due to the deterioration of the memory cell, data of the memory cell may not be read by using the read levels initially determined (e.g., the deterioration may cause damage or loss of data).

In the case where threshold voltage distributions of the graph G1 are formed by memory cells, optimum read levels for reading data stored in the memory cells may be VR1 to VR15. The graph G1 may be changed or shifted to the graph G2 due to the deterioration. In the case where the memory cells represent threshold voltage distributions such as the graph G2, optimum read levels for reading data stored in the memory cells may be VR1' to VR15', not VR1 to VR15.

In some example embodiments, the controller 210 may calculate the optimum read levels VR1 to VR15 for determining the states S1 to S16 based on the artificial neural network model learned by the computing device 100, a deterioration state of a block corresponding to the graph G1, and a number of the word line WL. Also, the controller 210 may calculate the optimum read levels VR1' to VR15' for determining the states S1 to S16 based on the artificial neural network model learned by the computing device 100, a deterioration state of a block corresponding to the graph G2, and a number of the word line WL.

Figure 4:
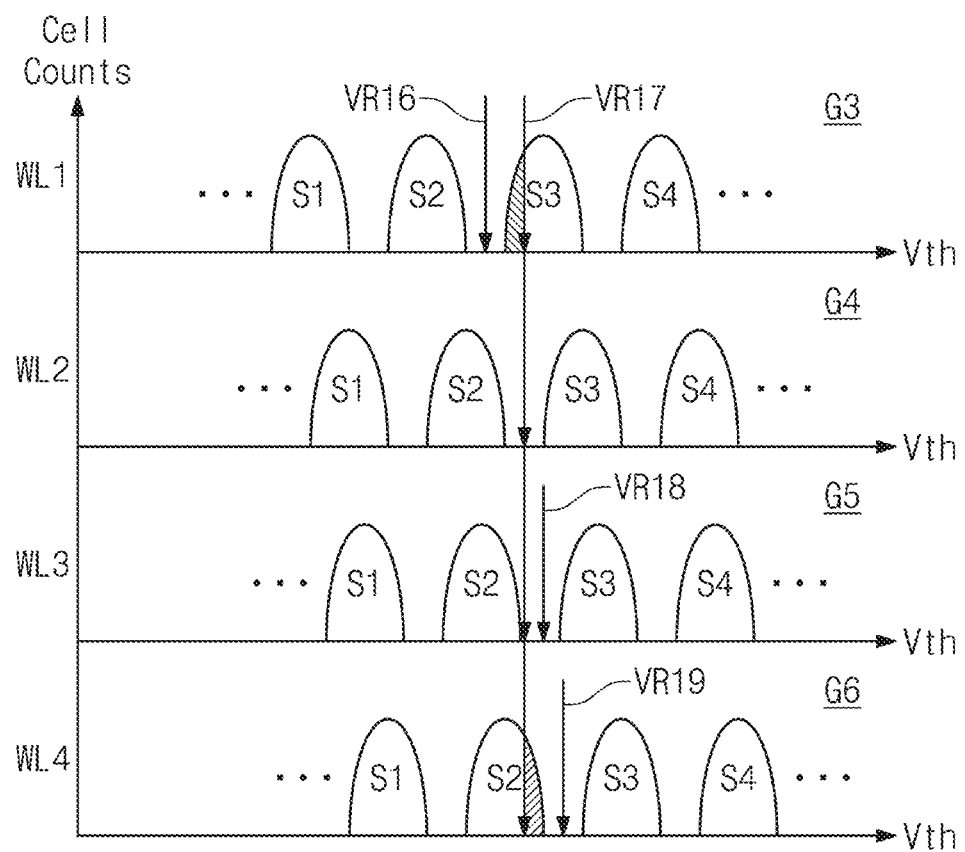
FIG. 4 illustrates graphs indicating distributions of threshold voltages of memory cells connected to word lines of FIG. 2.

FIG. 4 illustrates graphs indicating threshold voltage distributions of memory cells connected to word lines of FIG. 2. Graphs G3 to G6 illustrate distributions of threshold voltages of memory cells connected to the word lines WL1 to WL4, respectively. In FIG. 4, a horizontal axis represents threshold voltages of memory cells, and a vertical axis represents cell counts, that is, the number of memory cells. The word lines WL1 to WL4 may be included in one block of the non-volatile memory 220 described with reference to FIGS. 1 and 2. The word lines WL1 to WL4 may be a subset of the word lines of one block. Only a subset of states S1 to S4 of a plurality of states are illustrated in FIG. 4.

As the degree of integration of the non-volatile memory 220 increases, the number of bits stored in a memory cell may increase; and as the number of word lines or layers of a block stacked in a vertical direction increases, deterioration of the memory cell may become worse (e.g., may occur at an accelerated rate). In particular, even though memory cells are included in the same block, a shift of a threshold voltage distribution of the memory cells tends to vary for each word line (e.g., a word line variation). That is, the rate and/or degree of deterioration of the memory cells, and hence the shift of the threshold voltage distributions of the memory cells, may be different for different word lines.

Referring to FIG. 4, the graphs G3 to G6 respectively indicating distributions of threshold voltages of memory cells connected to the word lines WL1 to WL4 may be different from each other. In FIG. 4, it is assumed that a read level initially set for determining the states S2 and S3 is VR17 and that the read level VR17 is applied to all word lines of a block. When the read level VR17 is applied to the word lines WL2 and WL3, the states S2 and S3 of memory cells connected to the word lines WL2 and WL3 may be determined or identified. However, when the read level VR17 is applied to the word lines WL1 and WL4, the states S2 and S3 of memory cells connected to the word lines WL1 and WL4 may not be appropriately determined or identified (this means that an error occurs at memory cells included in the shaded portion in FIG. 5).

Accordingly, the states S2 and S3 may be determined or identified upon applying a read level VR16 that is different from (e.g., less than) the read level VR17 to the word line WL1 and applying a read level VR19 that is different from (e.g., greater than) the read level VR17 to the word line WL4. That is, an optimum read level may be applied for each word line, respectively. According to some example embodiments, the read level VR16 may be applied to the word line WL1, the read level VR17 may be applied to the word line WL2, the read level VR18 may be applied to the word line WL3, and the read level VR19 may be applied to the word line WL4. The read level VR18 may be greater than the read level VR17 and less than the read level VR19, for example.

The controller 210 may calculate the optimum read level VR16 for determining the states S2 and S3 based on the artificial neural network model learned by the computing device 100, a deterioration state of a block, and a number of the word line WL1. The controller 210 may further calculate optimum read levels for determining any other states (e.g., S1, S4, etc.) as well as the states S2 and S3, based on the artificial neural network model learned by the computing device 100, a deterioration state of a block, and a number of the word line WL1. As in the word line WL1, the controller 210 may calculate optimum read levels (e.g., VR17, VR18, and VR19) for the word lines WL2, WL3, and WL4 based on the artificial neural network model learned by the computing device 100, a deterioration state of a block, and numbers of the word lines WL2, WL3, and WL4, respectively. Accordingly, optimum (or improved) read levels capable of coping with various shift of the threshold voltage distributions due to the actual usage patterns and the actual usage environment may be determined and stored (or updated) dynamically over time, instead of the changed read levels being determined and stored in advance based on an average usage pattern and a typical usage environment.

Figure 5:
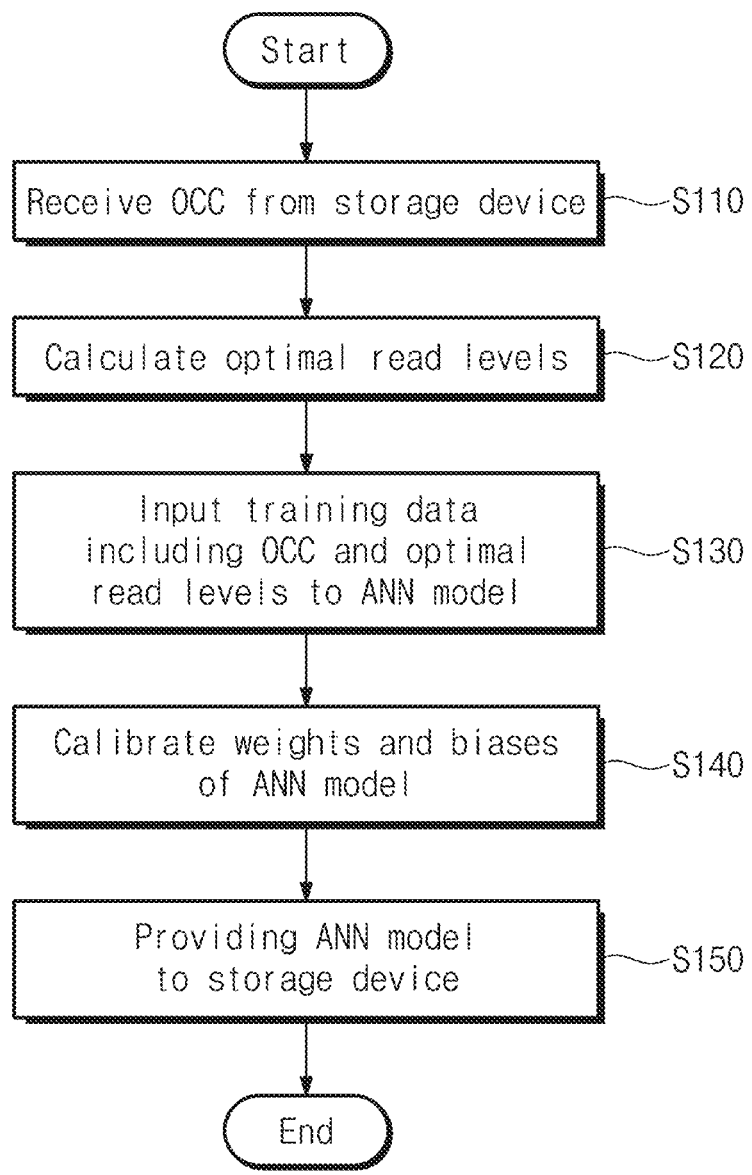
FIG. 5 illustrates a flowchart of an operating method of a computing device of FIG. 1.

FIG. 5 illustrates a flowchart of an operating method of a computing device of FIG. 1. The flowchart of FIG. 5 relates to a method in which the computing device 100 trains or learns the artificial neural network model to be mounted on the storage device 200. The flowchart of FIG. 5 relates to a method of learning optimum read levels to be applied to word lines of each of the blocks in the non-volatile memory 220 of the storage device 200.

In operation S110, the computing device 100 may receive an OCC from the storage device 200. The OCC may indicate an on-cell count or an off-cell count. The on-cell count OCC may indicate the number of memory cells, which have threshold voltages lower than the read level, from among memory cells connected to any word line of the non-volatile memory 220. The on-cell count OCC may indicate the number of memory cells, which are turned on by the read level, from among memory cells connected to a word line. The off-cell count OCC may indicate the number of memory cells, which have threshold voltages higher than the read level, from among the memory cells connected to the word line. The off-cell count OCC may indicate the number of memory cells, which are turned off by the read level, from among memory cells connected to a word line. In the following description, it is assumed that the OCC is an on-cell count. However, as described above, the OCC may be used to indicate an off-cell count in some other example embodiments.

In operation S110, the storage device 200 may read OCCs of all word lines of all blocks in all the non-volatile memories 220 in response to a request of the computing device 100 and may output the read OCCs to the computing device 100. Also, the storage device 200 may read OCCs of all the word lines while changing a read level to be applied to all the word lines and may output the read OCCs to the computing device 100. Here, the read level for acquiring the OCC may be a voltage to be applied to a word line and may be within a range of a threshold voltage of a memory cell. For example, the read level for acquiring the OCC may be changed in a unit of 1 mV, 5 mV, 10 mV, or 20 mV, which the storage device 200 supports.

In operation S120, the computing device 100 may calculate optimum read levels (e.g., refer to VR1 to VR15 or VR1' to VR15' of FIG. 3) for reading data based on the OCC received in operation S110. The computing device 100 may respectively calculate optimum read levels to be applied to word lines of blocks of the non-volatile memory 220 of the storage device 200. For example, based on OCCs read and accumulated as read levels increasing in a micro-unit are applied to one word line, the computing device 100 may check distributions of threshold voltages of memory cells connected to the one word line and may calculate optimum read levels for reading data. Here, the read level for acquiring the OCC and the optimum read levels for reading data may be different from each other. For example, the read level for acquiring the OCC may be applied to a word line according to an SLC read operation. In contrast, the read levels for reading data may be applied to a word line according to a QLC read operation. The computing device 100 may repeatedly perform the above-described operation on all word lines of the non-volatile memories 220.

In operation S130, the processor 110 of the computing device 100 may generate training data including the OCC of operation S110 and the optimum read levels of operation S120, and may store the training data in the memory 120. The processor 110 may input or provide the training data to the artificial neural network model stored in the memory 120. Examples of the training data will be more fully described with reference to FIGS. 6 and 7.

In operation S140, the processor 110 may calibrate weights and biases of the artificial neural network model based on the training data of operation S130. Before operation S140 is performed, output data which are output from the artificial neural network model receiving input data of the training data may be different from output data of the training data. Accordingly, operation S140 may be repeatedly performed by the processor 110 such that the artificial neural network model receives the input data of the training data and outputs optimum read levels being the output data of the training data.

In operation S150, the computing device 100 may provide the storage device 200 with the artificial neural network model which is learned through repeatedly performing operation S140. The storage device 200 may execute the artificial neural network model learned by the computing device 100 and may read data by applying the optimum read levels to a target word line (e.g., corresponding to a request of a host).

Figure 6:
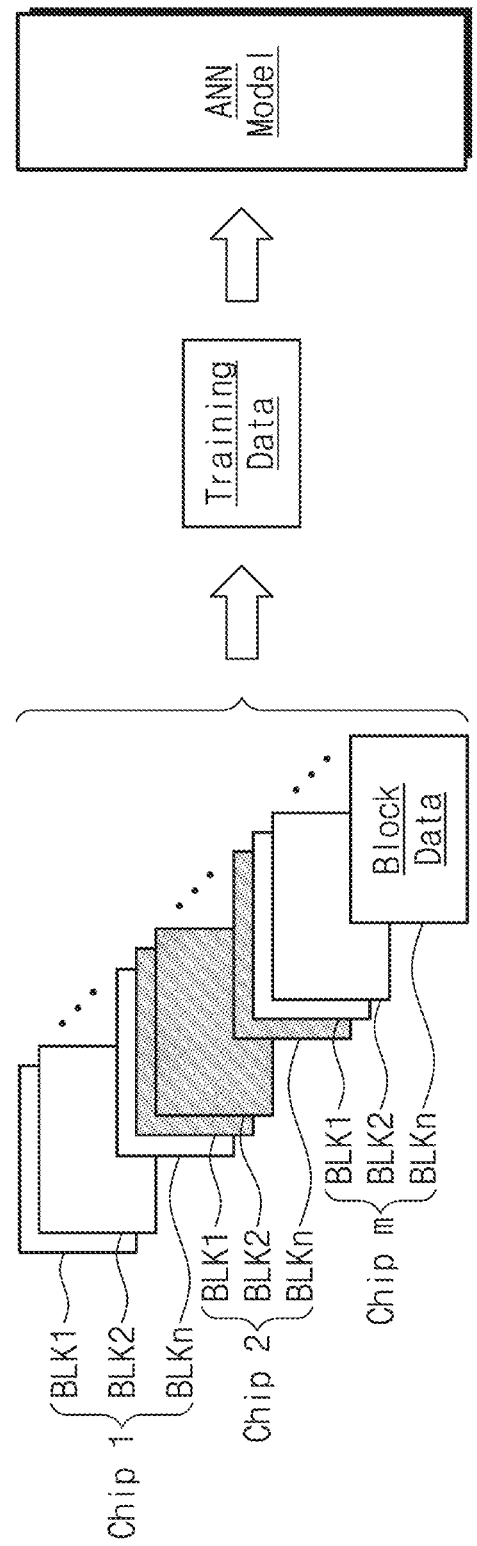
FIG. 6 illustrates training data of operation S130 of FIG. 5.

FIG. 6 illustrates training data of operation S130 of FIG. 5. In FIG. 6, it is assumed that the storage device 200 includes "m" non-volatile memories 220 (e.g., chip 1, chip 2, . . . , chip m) and one non-volatile memory 220 includes "n" blocks (e.g., BLK1, BLK2, . . . , BLKn). Here, each of "m" and "n" may be an integer of 2 or more.

The processor 110 may generate a plurality of block data respectively corresponding to the "n" blocks of the "m" non-volatile memories 220. Training data may include a plurality of block data. The training data may be stored in the memory 120 and may be input to the artificial neural network model.

FIG. 7 illustrates block data of training data of FIG. 6. For example, block data of FIG. 7 may relate to one block of the non-volatile memory 220.

Referring to FIG. 7, the block data may include input data corresponding to input features and output data corresponding to labels. The input data may include an OCC1 and an OCC2 of a reference word line Ref WL and numbers of word lines of one block. The output data may include sets of optimum read levels to be respectively applied to the word lines of the block.

Here, a word line, which best indicates a deterioration state of the block, may be selected as the reference word line Ref WL from among the word lines of the block, and any one of the word lines of the block may be selected as the reference word line. The fourth word line WL4 of the word lines WL4 to WL64 is selected as a reference word line of one block associated with the block data in FIG. 7, for example.

The OCC1 may indicate the number of memory cells, which are turned on by a first read level, from among memory cells connected to the reference word line. The OCC2 may indicate the number of memory cells, which are turned on by a second read level, from among the memory cells connected to the reference word line. The first read level and the second read level may be different from each other and may be within a range of threshold voltages of the memory cells. The number of first and second read levels may be less than the number of optimum read levels (refer to VR1 to VR15 or VR1' to VR15' of FIG. 3) of operation S120 for determining data of memory cells. For example, the first read level may be determined in advance depending on a correlation with lower read levels of the read levels of operation S120. For example, the second read level may be determined in advance depending on a correlation with upper read levels of the read levels of operation S120. The optimum read levels of operation S120 may be classified into the lower read levels and the upper read levels, and the lower read levels and the upper read levels may be different from each other.

In some example embodiments, a number of the fifth word line WL5 may configure the input data together with the OCC1 and the OCC2 of the fourth word line WL4 being the reference word line. Also, each of numbers of other word lines WL6 to WL64 may configure the input data together with the OCC1 and the OCC2 of the fourth word line WL4. That is, the OCC1 and the OCC2 of the reference word line may be applied to the remaining word lines in a block including the reference word line. Both the OCC1 and the OCC2 of the input data may be associated with the reference word line. However, an optimum read level set of the output data may be calculated in operation S120 for each word line of the block. The optimum read level set may include optimum read levels (e.g., VR1 to VR15 or VR1' to VR15') calculated in operation S120.

For example, the artificial neural network model may be learned by the processor 110 so as to receive the OCC1 and the OCC2 of the fourth word line WL4 and a number of the fourth word line WL4 and output the optimum read level set of the fourth word line WL4 calculated in operation S120. The artificial neural network model may be learned by the processor 110 so as to receive the OCC1 and the OCC2 of the fourth word line WL4, not the OCC1 and the OCC2 of the fifth word line WL5, and a number of the fifth word line WL5 and output the optimum read level set of the fifth word line WL5 calculated in operation S120. That is, when the artificial neural network model is learned by the processor 110 with regard to a read level set of the fifth word line WL5, the OCC1 and the OCC2 of the fourth word line WL4, not the OCC1 and the OCC2 of the fifth word line WL5, may be used. The optimum read level set of the fifth word line WL5 may be different from the optimum read level set of the fourth word line WL4.

In some example embodiments, the block data of FIG. 7 may further include input data and output data in the case where the reference word line is changed to another word line. For example, the reference word line may be the sixth word line WL6. The processor 110 may include input data, which include the OCC1 and the OCC2 of the sixth word line WL6 and numbers of the word lines of the block, and output data, which include sets of optimum read levels to be applied to the word lines of the block, in the block data of FIG. 7 or in training data as new block data. In the same deterioration state of the block, optimum read level sets when the reference word line is the fourth word line WL4 may be identical to optimum read level sets when the reference word line is the sixth word line WL6. Thus, the artificial neural network model may also be learned in the case where a number of a reference word line of the block is changed.

In some example embodiments, the block data of FIG. 7 may further include input data and output data in the case where the first and second read levels are changed to other read levels. For example, third and fourth read levels may be used instead of the first and second read levels for acquiring the OCC. In this case, the input data may include an OCC3 and an OCC4 acquired by applying the third and fourth read levels and numbers of the word lines of the block. The processor 110 may include input data, which include the OCC3 and the OCC4 and the numbers of the word lines of the block, and output data, which include sets of optimum read levels to be applied to the word lines of the block, in the block data of FIG. 7 or in training data as new block data. In the same deterioration state of the block, optimum read level sets when the input data include the OCC1 and the OCC2 may be identical to optimum read level sets when the input data include the OCC3 and the OCC4. Thus, the artificial neural network model may also be learned in the case where a read level for acquiring the OCC is changed.

In some example embodiments, the block data of FIG. 7 may include input and output data associated with a specific deterioration condition, but the block data of FIG. 7 may include a plurality of input data and a plurality of output data associated with various deterioration conditions in some other example embodiments. For example, the deterioration conditions may be set in advance depending on retention times (e.g., 0 h, 5 h, . . . , 150 h), read counts (e.g., RD #0, RD #200, . . . , RD #1000), or various combinations of retention times and read counts. The processor 110 may configure input data and output data associated with each of the various deterioration conditions and may include the input data and the output data in block data. Thus, as a deterioration condition is changed, the OCC1 and the OCC2 included in the input data may be changed, and optimum read level sets included in the output data may be changed.

Figure 8:
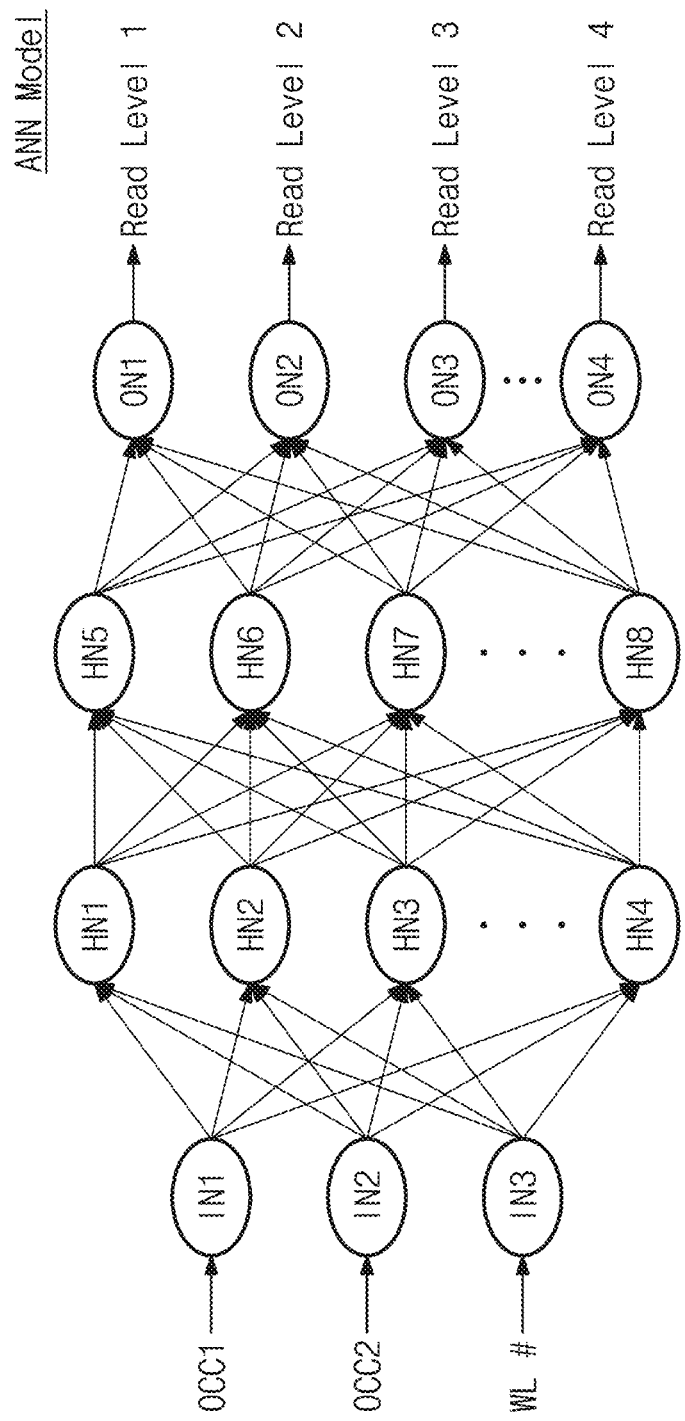
FIG. 8 illustrates a structure of an artificial neural network model of FIG. 1.

FIG. 8 illustrates a structure of an artificial neural network model of FIG. 1. The artificial neural network model may include input nodes IN1 to IN3 configuring an input layer, hidden nodes HN1 to HN8 configuring at least one hidden layer, and output nodes ON1 to ON4 configuring an output layer.

The OCC1 of the training data may be input to the input node IN1. The OCC2 of the training data may be input to the input node IN2. A number of a word line of the training data may be input to the input node IN3. In some example embodiments, as illustrated in FIG. 7, the number of OCCs of a reference word line is "2", but the number of OCCs may be greater than 2 in some other example embodiments. The number of input nodes receiving OCCs may be 2 or more. Input nodes may be provided with OCCs of a plurality of blocks of a plurality of non-volatile memories 220 at the same time or altogether.

The hidden nodes HN1 to HN8 may apply weights between the input nodes IN1 to IN3, the hidden nodes HN1 to HN8, and the output notes ON1 to ON4, and may apply biases of the input nodes IN1 to IN3, the hidden nodes HN1 to HN8, and the output nodes ON1 to ON4 to the OCC1, the OCC2, and the number of the word line input to the input nodes IN1 to IN3. For example, a value input to a first node among the input nodes IN1 to IN3, the hidden nodes HN1 to HN8, and the output nodes ON1 to ON4 may be transferred to a second node among the input nodes IN1 to IN3, the hidden nodes HN1 to HN8, and the output nodes ON1 to ON4; in this case, a weight(s) and a bias(es) associated with the first node and the second node may be applied to the value input to the first node. The number of the hidden nodes HN1 to HN8 illustrated in FIG. 8 is only a non-limiting example embodiment, and some other example embodiments may have different numbers of hidden nodes.

The output nodes ON1 to ON4 may output read levels Read Level 1 to Read Level 4, respectively. In FIG. 8, the number of the output nodes ON1 to ON4 and the number of read levels are only a non-limiting example embodiment, and may be determined according to the number of bits stored in one memory cell of the non-volatile memory 220 (e.g., in the case where a memory cell is a QLC, the number of read levels is "15"). The processor 110 may calibrate or calculate weights and biases of the artificial neural network model by repeatedly performing operation S140 until read levels being an output of the artificial neural network model are identical to the optimum read levels of operation S120 of FIG. 5, or until a difference between the read levels being the output of the artificial neural network model and the optimum read levels of operation S120 of FIG. 5 is less than a threshold value.

Figure 9:
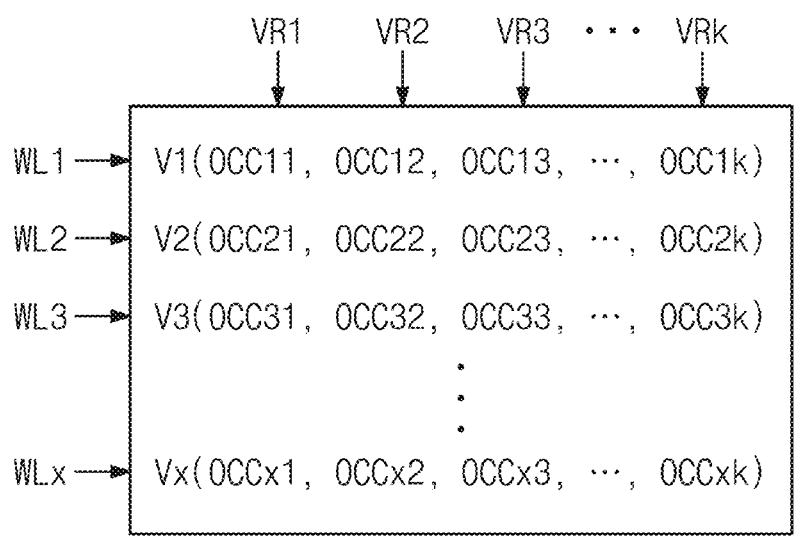
FIG. 9 illustrates how to express word lines with vectors for selecting one of the word lines of a block as a reference word line, according to some example embodiments of the inventive concepts.

FIG. 9 illustrates how to express word lines with vectors for selecting one of the word lines of a block as a reference word line, according to some example embodiments of the inventive concepts. Word lines WL1 to WLx of FIG. 9 may be included in one block of the non-volatile memory 220 described with reference to FIG. 1, and "x" may be a natural number of 2 or more. One of the word lines WL1 to WLx of the block may be selected as the reference word line so that the OCCs of the reference word line indicate a deterioration state of the block.

The controller 210 may apply read levels VR1 to VRk to the word lines WL1 to WLx, respectively, for selecting the reference word line. The read levels VR1 to VRk of FIG. 9 are different from the read levels VR1 to VR15 and VR16 to VR19 of FIGS. 3 and 4. The read levels VR1 to VRk may be different from each other and may be within a range of threshold voltages of memory cells, and "k" may be a natural number of 2 or more. The number of read levels VR1 to VRk and a difference between the read levels VR1 to VRk may be determined in advance. OCCs of the word lines WL1 to WLx read by respectively applying the read levels VR1 to VRk to the word lines WL1 to WLk may be vector components of the word lines WL1 to WLx.

For example, components of a vector V1 of the word line WL1 may include OCC11 read by the read level VR1, OCC12 read by the read level VR2, OCC13 read by the read level VR3, and OCC1k read by the read level VRk. Components of vectors V2 to Vk of the remaining word lines WL2 to WLk may be generated in a similar manner as the components of the vector V1 of the word line WL1. The components of the vector V2 of the word line WL2 may include OCC21 to OCC2k, the components of the vector V3 of the word line WL3 may include OCC31 to OCC3k, and the components of the vector Vx of the word line WLx may include OCCx1 to OCCxk.

In some example embodiments, a sum of vector-based similarities between the word lines WL1 to WLx may be calculated to check similarities of the word lines WL1 to WLx. First, a description will be given with regard to the word line WL1. A sum of vector-based similarities between the word line WL1 and the remaining word lines WL2 to WLx may be calculated by adding a similarity between the word line WL1 and the word line WL2, a similarity between the word line WL1 and the word line WL3, and a similarity between the word line WL1 and the word line WLx. In a similar manner, a sum of vector-based similarities associated with each of the word lines WL2 to WLx may be calculated.

One of the word lines WL1 to WLx may be selected as a reference word line based on the sums of the vector-based similarities. For example, in a case where the word line WL3 is selected as the reference word line, a sum of vector-based similarities between the word line WL3 and the remaining word lines WL1, WL2, and WL4 to WLx may be maximum. A sum of vector-based similarities associated with the word line WL3 may be greater than sums of vector-based similarities associated with the remaining word lines WL1, WL2, and WL4 to WLx. The word line WL3 may be the reference word line, and OCCs of the word line WL3 may represent or indicate a deterioration state of a block.

As described above, one of the word lines WL1 to WLx of a block is selected as a reference word line. The blocks BLK1 to BLKn of FIG. 6 (also refer to FIG. 10 below) may be manufactured identically to each other, and numbers of reference word lines of the blocks BLK1 to BLKn may be identical to each other. That is, a location of a reference word line of the first block BLK1 may be identical to locations of reference word lines of the remaining blocks BLK2 to BLKn. In the case where a reference word line of a block is selected, the controller 210 may apply a read level only to the reference word line of the block, not to all of the word lines of the block, for monitoring OCCs of the block. Accordingly, an amount of time to monitor OCCs of a block may decrease, and the amount of OCCs to be stored in the buffer memory 230 may decrease.

Figure 10:
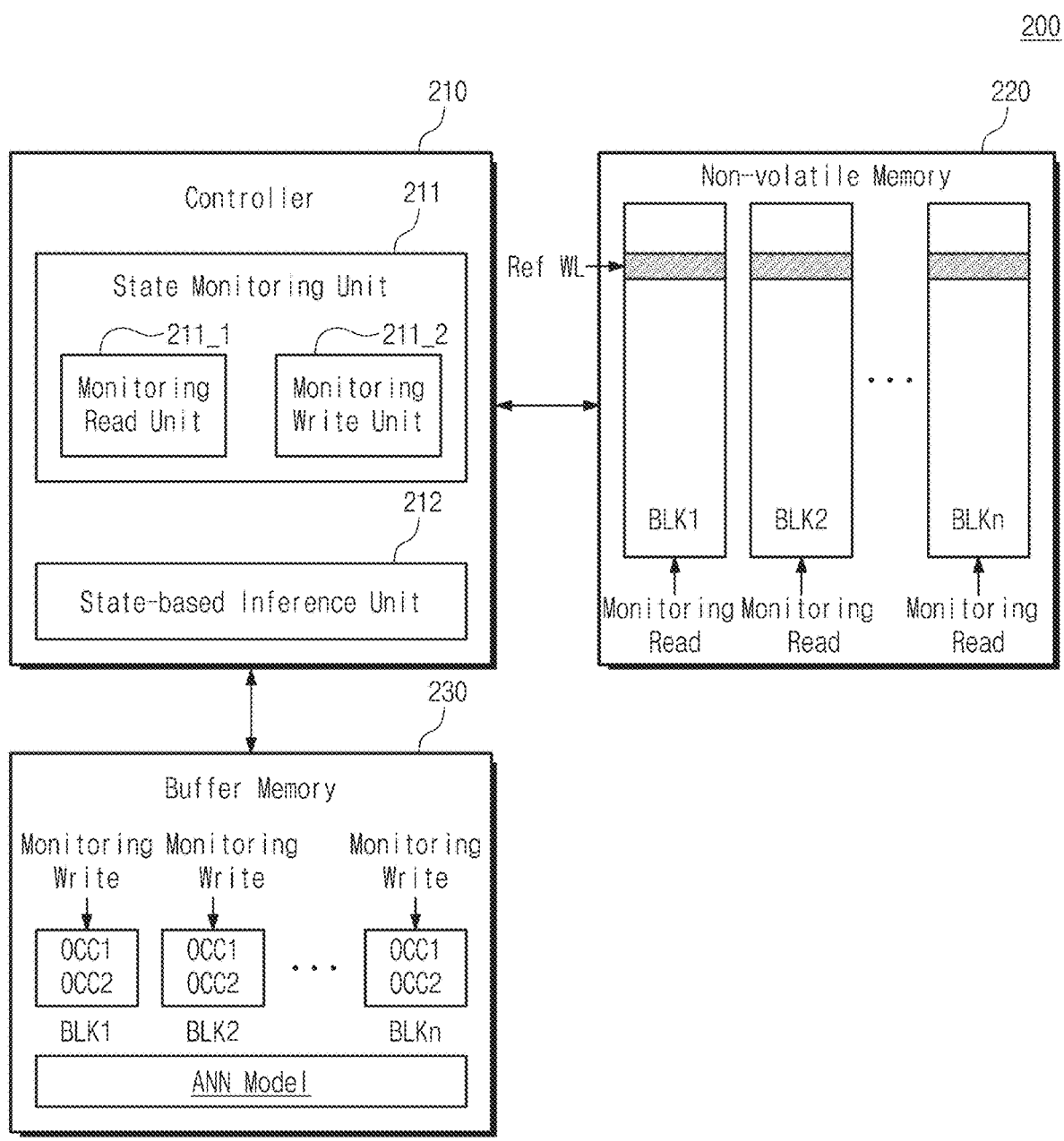
FIG. 10 illustrates a block diagram of a storage device of FIG. 1.

FIG. 10 illustrates a block diagram of a storage device of FIG. 1. The controller 210 may perform a write operation, a read operation, and/or an erase operation on the non-volatile memory 220 in response to a request of a host (the host being a different device from the computing device 100 of FIG. 1). The controller 210 may temporarily store data to be stored in the non-volatile memory 220 and/or data read from the non-volatile memory 220 in the buffer memory 230. The controller 210 may store information about the non-volatile memory 220 in the buffer memory 230. The controller 210 may manage the storage device 200 by using the buffer memory 230. The controller 210 may be implemented with a system on chip (SoC), an application specific integrated circuit (ASIC), a field programmable gate array (FPGA), etc.

The controller 210 may include a state monitoring unit 211 and a state-based inference unit 212. A unit may refer to a circuit, a processor, etc. The state monitoring unit 211 and the state-based inference unit 212 may be implemented in the form of hardware within the controller 210. Alternatively, the state monitoring unit 211 and the state-based inference unit 212 may be implemented in the form of software, for example, a program code stored in the buffer memory 230 and executable by hardware (e.g., a processor) within the controller 210.

The state monitoring unit 211 may monitor a deterioration state (or aging state) of each of the blocks BLK1 to BLKn in the non-volatile memory 220. To this end, the state monitoring unit 211 may include a monitoring read unit 211_1 which reads a deterioration state of each of the blocks BLK1 to BLKn and a monitoring write unit 211_2 which logs or stores the deterioration state in the buffer memory 230. The monitoring read unit 211_1 and the monitoring write unit 211_2 may be implemented in the form of hardware (e.g., a circuit, a processor, etc.) within the controller 210, or alternatively, in the form of software (e.g., a program code stored in the buffer memory 230) executable by hardware (e.g., a processor) within the controller 210.

The monitoring read unit 211_1 may monitor or check the blocks BLK1 to BLKn (n being a natural number of 2 or more) of the non-volatile memory 220. The monitoring read unit 211_1 may read memory cells connected to a reference word line Ref WL of the blocks BLK1 to BLKn by using a read level. The monitoring read unit 211_1 may calculate an OCC (e.g., an on-cell count) of each of the blocks BLK1 to BLKn based on a read result (e.g., read data output from the non-volatile memory 220).

As described above, the number of non-volatile memories 220 included in the storage device 200 may be one or more. The monitoring read unit 211_1 may monitor all blocks of all of the non-volatile memories 220 included in the storage device 200. The monitoring read unit 211_1 may repeat a monitoring read operation on each of the blocks of the storage device 200. The monitoring read operation indicates an operation of reading memory cells connected to the reference word line Ref WL by using the read level and calculating an OCC of each of the blocks.

The monitoring write unit 211_2 may store the OCC of each block calculated by the monitoring read unit 211_1 in the buffer memory 230. The monitoring read unit 211_1 may perform the monitoring read operation for each block, and the monitoring write unit 211_2 may perform a monitoring write operation for each block. The monitoring write operation indicates an operation of storing the OCC of each block calculated by the monitoring read unit 211_1 in the buffer memory 230. The monitoring write unit 211_2 may log the OCC of each block in the buffer memory 230 by writing or storing the OCC of each block in the buffer memory 230. Referring to FIG. 10, the monitoring write unit 211_2 may store two OCCs in the buffer memory 230 for each block. However, each of the number of OCCs of one block generated by the monitoring read unit 211_1 and the number of OCCs of one block stored by the monitoring write unit 211_2 may be greater than 2 in some other example embodiments.

The state-based inference unit 212 may infer an operating condition for accessing each of the blocks BLK1 to BLKn based on a deterioration state of each of the blocks BLK1 to BLKn monitored by the state monitoring unit 211. For example, the operating condition may include levels (or magnitudes) of voltages to be applied to the blocks BLK1 to BLKn, time points when voltages are applied to the blocks BLK1 to BLKn, and time intervals when voltages are applied to the blocks BLK1 to BLKn, etc. The state-based inference unit 212 may execute the artificial neural network model, which is learned and provided by the computing device 100, for inferring the operating condition.

The buffer memory 230 may store the OCC1 and the OCC2 of each of the blocks BLK1 to BLKn of the non-volatile memory 220. The number of OCCs stored in the buffer memory 230 for each block may be at least "2", and may be determined based on the number of non-volatile memories 220 included in the storage device 200, the number of blocks BLK1 to BLKn included in each of the non-volatile memories 220, the number of read levels, etc.

Figure 11:
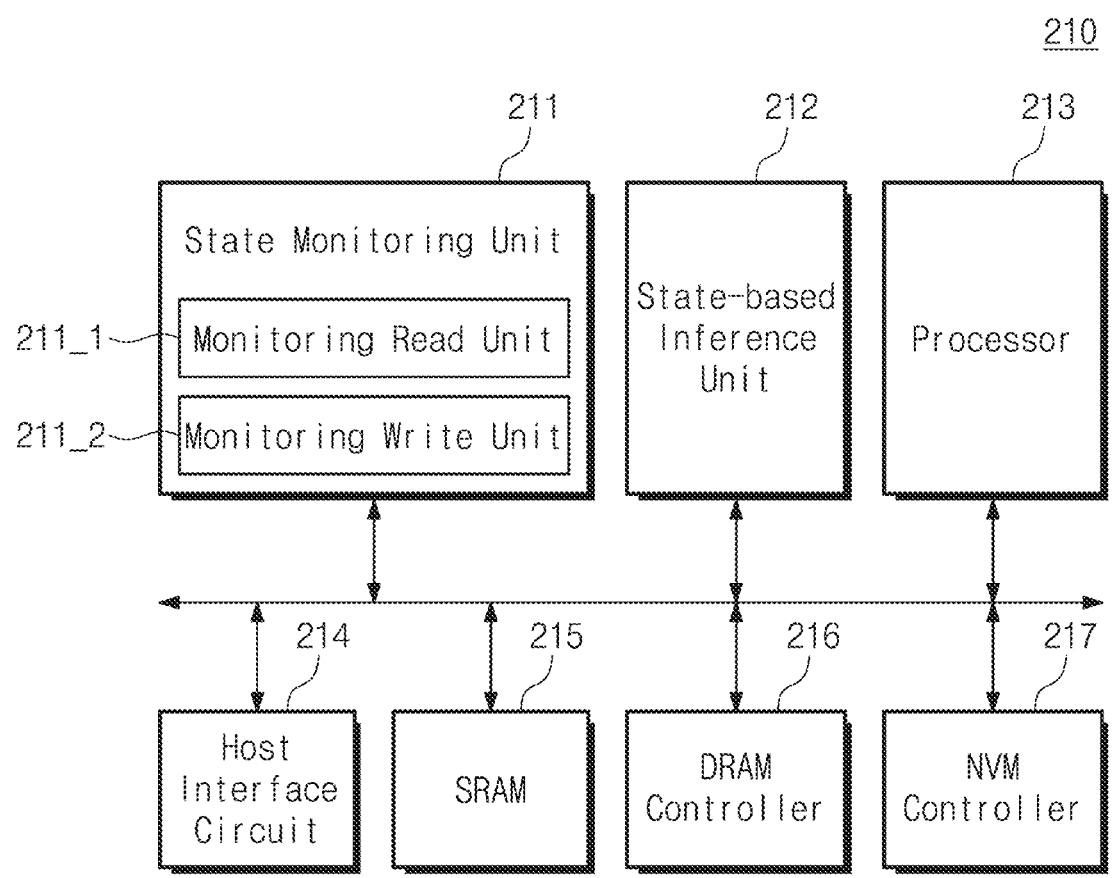
FIG. 11 illustrates a block diagram of a controller of FIG. 10.

FIG. 11 illustrates a block diagram of a controller of FIG. 10. The controller 210 may further include a processor 213, a host interface circuit 214, an SRAM 215, a DRAM controller 216, and an NVM controller 217, in addition to the state monitoring unit 211 and the state-based inference unit 212.

The processor 213 may control an operation of the controller 210, and may perform various logical operations. For example, the processor 213 may include a central processing unit (CPU), a graphics processing unit (GPU), a neural processing unit (NPU), a digital signal processor (DSP), etc., and the number of processors 213 may be at least "2" (e.g., a multi-core processor). In some example embodiments, as illustrated in FIG. 11, the state monitoring unit 211, the state-based inference unit 212, and the processor 213 are independent of each other, but the state monitoring unit 211 and the state-based inference unit 212 may be integrated in the processor 213 of the controller 210 in some other example embodiments. For example, in the case where the state monitoring unit 211 and the state-based inference unit 212 are implemented in the form of software, the processor 213 may execute a program code in which operations of the state monitoring unit 211 and the state-based inference unit 212 are described, and which is stored in the SRAM 215, a DRAM (not shown), or the buffer memory 230 (e.g., including the TCM).

The host interface circuit 214 may communicate with an external host (not shown) under control of the processor 213. The host interface circuit 214 may use at least one of various communication manners such as a universal serial bus (USB) manner, a serial AT attachment (SATA) manner, a serial attached SCSI (SAS) manner, a high speed interchip (HSIC) manner, a small computer system interface (SCSI) manner, a peripheral component interconnection (PCI) manner, a PCI express (PCIe) manner, a non-volatile memory express (NVMe) manner, a universal flash storage (UFS) manner, a secure digital (SD) manner, a multimedia card (MMC) manner, and/or an embedded MMC (eMMC) manner.

The SRAM 215 may be used as a cache memory of the processor 213. The SRAM 215 may store codes and commands which the processor 213 will execute. The SRAM 215 may store data processed by the processor 213. A program code in which operations of the state monitoring unit 211 and the state-based inference unit 212 are described, a flash translation layer FTL, and/or various memory management modules may be stored in the SRAM 215. The flash translation layer FTL may perform various functions for the non-volatile memory 220, such as address mapping, garbage collection, and/or wear leveling, for example.

The DRAM controller 216 may control a DRAM (not shown) included in the storage device 200 under control of the processor 213. For example, the DRAM controller 216 may communicate with the DRAM in a direct memory access (DMA) manner. The DRAM which is included in the storage device 200 and communicates with the DRAM controller 216 may configure the buffer memory 230 of FIG. 1 together with the SRAM 215 and/or the TCM. The DRAM controller 216 may be implemented in the form of hardware (e.g., a digital circuit, a chip, an integrated circuit, a microprocessor, etc.).

The NVM controller 217 may control the non-volatile memory 220 under control of the processor 213. The NVM controller 217 may provide a command and an address to the non-volatile memory 220 through an input/output channel and may exchange data with the non-volatile memory 220. The NVM controller 217 may be implemented in the form of hardware (e.g., a digital circuit, a chip, an integrated circuit, a microprocessor, etc.).

The NVM controller 217 may control the non-volatile memory 220 so that the non-volatile memory 220 reads memory cells connected to a reference word line of each of the blocks BLK1 to BLKn by using a read level under control of the state monitoring unit 211 or the processor 213. The NVM controller 217 may receive a read result or read data from the non-volatile memory 220 and may provide the read result or the read data to the state monitoring unit 211. The NVM controller 217 may control the non-volatile memory 220 so that the non-volatile memory 220 reads memory cells connected to a target word line by using optimum read levels under control of the state-based inference unit 212 or the processor 213. The NVM controller 217 may receive data, which are read based on the optimum read levels, from the non-volatile memory 220.

Figure 12:
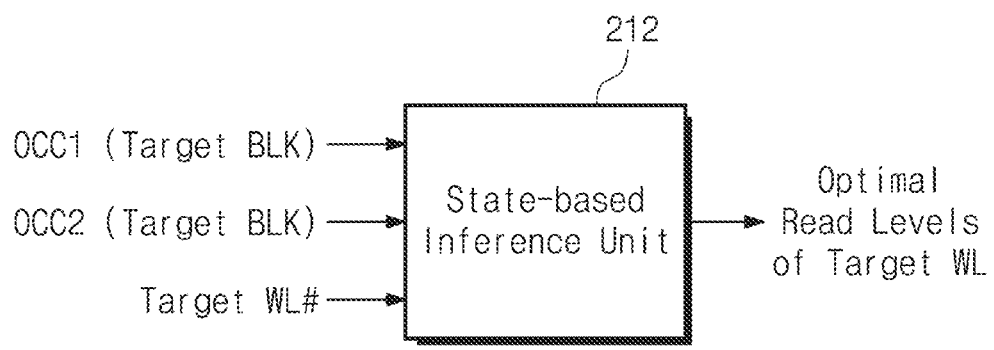
FIG. 12 illustrates an operation of a state-based inference unit of FIG. 11.

FIG. 12 illustrates an operation of a state-based inference unit of FIG. 11. In FIG. 12, it is assumed that the controller 210 receives a first read request from a host and accesses a first target word line of the first block BLK1 of the non-volatile memory 220 for processing the first read request.

The state-based inference unit 212 may infer, predict, or calculate optimum first read levels to be applied to the first target word line of the first block BLK1 based on the OCC1 and OCC2 of the first block BLK1 stored in the buffer memory 230. The state-based inference unit 212 may input the OCC1 and OCC2 of the first block BLK1 and a number of the first target word line to the artificial neural network model and may acquire optimum first read levels calculated by the artificial neural network model. In addition to the above assumption, the controller 210 may receive a second read request and may access a second target word line of the first block BLK1 of the non-volatile memory 220 for processing the second read request. The state-based inference unit 212 may input the OCC1 and OCC2 of the first block BLK1 and a number of the second target word line to the artificial neural network model and may acquire optimum second read levels calculated by the artificial neural network model. Since the number of the first target word line and the number of the second target word line are different from each other, the optimum first read levels and the optimum second read levels may be different from each other.

The state-based inference unit 212 may further infer any other operating conditions (e.g., program levels and/or erase levels) of the target word line. The target word line is any word line of word lines of the first block BLK1. The target word line may be the reference word line Ref WL or may be different from the reference word line Ref WL.

Figure 13:
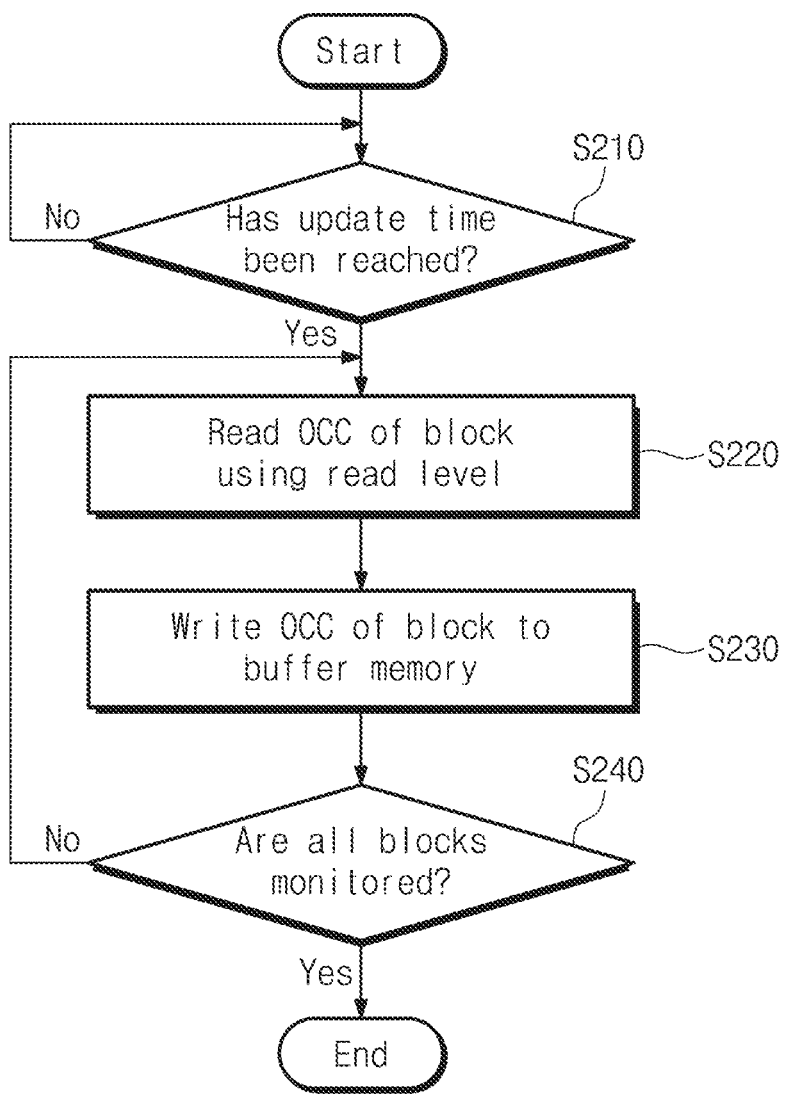
FIG. 13 illustrates a flowchart of an operating method of a storage device according to some example embodiments of the inventive concepts.

FIG. 13 illustrates a flowchart of an operating method of a storage device according to some example embodiments of the inventive concepts. An operating method of a storage device of FIG. 13 relates to a method of periodically monitoring OCCs of the blocks BLK1 to BLKn of the non-volatile memory 220 illustrated in FIG. 10.

In operation S210, the controller 210 may determine whether an update time for checking OCCs of blocks has been reached. When an update period determined in advance has elapsed ("Yes" at S210), the controller 210 repeatedly performs operations S220 to S240 to periodically update OCCs stored in the buffer memory 230. Also, the controller 210 may further determine whether a request of a host does not exist. The operation of updating and monitoring the OCCs may be performed as a background operation of the storage device 200 without a request of the host. The storage device 200 according to some example embodiments may maintain the quality of service (QoS) for the host while monitoring and storing the OCCs of the blocks.

In operation S220, the controller 210 may read an OCC of a block by using a read level. The state monitoring unit 211 of the controller 210 may apply the read level to a reference word line of the block and may read an OCC of the reference word line. The controller 210 may transmit a command (or a request) for acquiring the OCC to the non-volatile memory 220. The controller 210 may receive read data from the non-volatile memory 220 that receives the command and may calculate the OCC of the reference word line based on the read data. The OCC of the reference word line may correspond to an OCC of the block.

In operation S230, the controller 210 may write the OCC of the block monitored in operation S220 in the buffer memory 230. Thus, as the above-described deterioration occurs over time, the OCC of the reference word line may be periodically updated in the buffer memory 230. Since a read operation is performed only on the reference word line of the block, not on all of the word lines of the block, by using the read level, the amount of OCCs to be stored in the buffer memory 230 may decrease. The monitoring write unit 211_2 may compare a new OCC of a block read by the monitoring read unit 211_1 with an old OCC (a previous OCC corresponding to the new OCC) of the block previously stored in the buffer memory 230. The monitoring write unit 211_2 may store (update) the new OCC in the buffer memory 230 instead of the previous OCC, based on a comparison result. For example, only in a case where a difference between the new OCC and the previous OCC is greater than a threshold value, the monitoring write unit 211_2 may store the new OCC in the buffer memory 230. On the other hand, in a case where the difference between the new OCC and the previous OCC is less than the threshold value, this may mean that a deterioration state of the block is relatively less severe, and the monitoring write unit 211_2 may not store the new OCC in the buffer memory 230 (that is, the old OCC corresponding to the new OCC that was previously stored remains stored in the buffer memory 230). Accordingly, the number of times that the buffer memory 230 is accessed by the controller 210 to store the new OCC in the buffer memory 230 may be reduced, and an amount of time to access the buffer memory 230 may be reduced. The monitoring write unit 211_2 may adjust an update period for monitoring an OCC, based on the comparison result. For example, the monitoring write unit 211_2 may calculate differences between new OCCs and previous OCCs of blocks, and may increase the update period when a sum of the differences is less than a threshold value. In a case where the sum of the differences is less than the threshold value, this may mean that deterioration states of the blocks are relatively less severe, and the controller 210 may monitor the OCCs of the blocks relatively slowly according to the increased update period. That is, when the deterioration states of the blocks are relatively less severe, the periodic monitoring and updating of the OCCs of the blocks may be performed less frequently by increasing the update period, thereby reducing consumption of computing resources and improving efficiency of the operating method of the storage device 200.

In operation S240, the controller 210 may determine whether all blocks of the non-volatile memory 220 are monitored. In some example embodiments, the controller 210 may determine whether all blocks of a plurality of non-volatile memories 220 included in the storage device 200 are monitored. When the controller 210 determines that all of the blocks have not yet been monitored ("No" at S240), the controller 210 may repeatedly perform operation S220, operation S230, and operation S240 until all of the blocks have been monitored ("Yes" at S240). The controller 210 may periodically perform operation S220 and operation S230 for updating the OCCs. As described above, since the operation of periodically monitoring OCCs is a background operation, an order in which blocks of the storage device 200 are monitored and accessed may be determined in advance. The controller 210 may sequentially monitor OCCs of the blocks of the non-volatile memory 220.

In some example embodiments, upon receiving a request for a target word line of a target block from a host, the controller 210 may input the OCC1 and the OCC2 of the target block and a number of the target word line to an artificial neural network model, and may infer optimum read levels for reading data of memory cells connected to the target word line using the artificial neural network model. After operations S210 to S240 are performed, the controller 210 may again receive the request for the target word line of the target block from the host. In a case where a result of the periodic monitoring of the OCCs indicates the OCC1 and the OCC2 of the target block are changed, the optimum read level for the target word line inferred by the controller 210 may also be changed. That is, an optimum read level before updating an OCC may be different from an optimum read level after updating the OCC. On the other hand, in a case where an OCC is not changed through an update, an optimum read level inferred by the controller 210 may not be changed.

Figure 14:
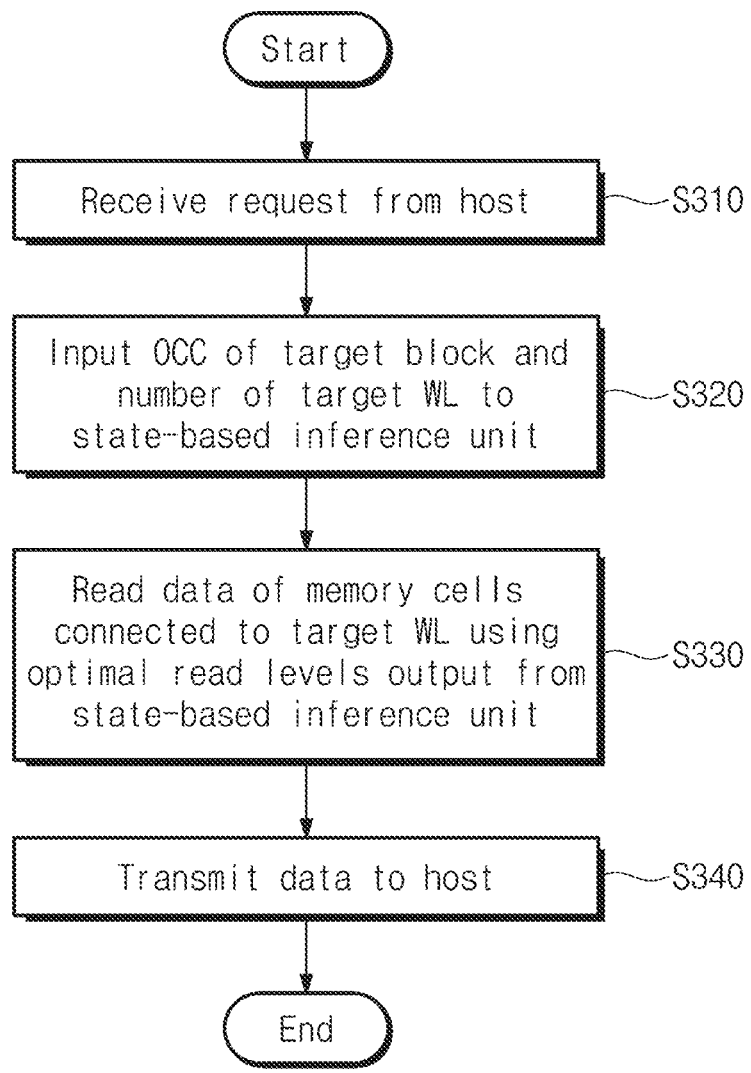
FIG. 14 illustrates a flowchart of an operating method of a storage device according to some example embodiments of the inventive concepts.

FIG. 14 illustrates a flowchart of an operating method of a storage device according to some example embodiments of the inventive concepts.

In operation S310, the controller 210 of the storage device 200 may receive a request from a host. For example, the host may request the storage device 200 to output data. When the request is received from the host while the controller 210 is performing operations S220 to S240 described above, the controller 210 may suspend (e.g., temporarily pause) performing operations S220 to S240, may first process the request of the host, and may then resume performing operations S220 to S240. Also, even though the update time described in operation S210 has been reached, in the case where a request is received from the host, the controller 210 may first process the request of the host before performing the periodic monitoring and updating of the OCCs of the blocks. That is, although the update period for monitoring the OCCs may have elapsed, the controller 210 may first process the request of the host corresponding to operation S310 of FIG. 14, instead of performing operations S220 to S240 of FIG. 13.

In operation S320, the controller 210 may input a number of a target word line corresponding to the request of the host and an OCC of a target block to which the target word line belongs, to the state-based inference unit 212. The state-based inference unit 212 may calculate optimum read levels for the target word line based on the OCC of the target block and the number of the target word line, and may output the optimum read levels for the target word line. The controller 210 may then provide the optimum read levels to the non-volatile memory 220.

In operation S330, the controller 210 may read data of memory cells connected to the target word line by using the optimum read levels output from the state-based inference unit 212 and provided to the non-volatile memory 220. The non-volatile memory 220 may read data of memory cells connected to the target word line by using the optimum read levels provided from the controller 210, and may output the read data to the controller 210. In some example embodiments, a latency (or delay) for the non-volatile memory 220 to output read data in response to a command of the controller 210 corresponding to the host request of operation S310 may be longer than a latency (or delay) for the non-volatile memory 220 to output read data in response to a command of the controller 210 of operation S220 for acquiring (reading) an OCC of a block.

In operation S340, the controller 210 may transmit the data read in operation S330 to the host. Thus, the controller 210 may process the host request of operation S310. In some example embodiments, upon receiving a host request, the controller 210 may infer, predict, or calculate optimum read levels for a target word line. Accordingly, even though the deterioration of a block of the non-volatile memory 220 progresses, a read retry count may be minimized (or reduced), and a read reclaim operation associated with the deterioration-progressing block may be delayed maximally (or performed less frequently).

According to some example embodiments of the inventive concepts, an artificial neural network model may be mounted on a storage device. The artificial neural network model may infer optimum read levels to be applied to a word line. For example, the OCC (e.g., on-cell count), which indicates a deterioration state of a block, may be monitored and stored (or updated) by using a read level for a reference word line, and the optimum read levels may be inferred based on the OCC using the artificial neural network model. Accordingly, the number of times of occurrence of a read retry event of a storage device and the number of times of occurrence of a read reclaim event of the storage device may decrease, and the performance and reliability of the storage device may be improved.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A storage device comprising:
a non-volatile memory comprising a plurality of blocks;
a buffer memory configured to store a plurality of on-cell counts, which are generated by reading memory cells connected to a plurality of reference word lines of the plurality of blocks by using a read level, and an artificial neural network model; and
a controller configured to,
input an on-cell count corresponding to a target block among the plurality of on-cell counts and a number of a target word line of the target block to the artificial neural network model, and
infer a plurality of read levels for reading data of memory cells connected to the target word line using the artificial neural network model.

2. The storage device of claim 1, wherein the plurality of read levels are an output of the artificial neural network model associated with the on-cell count of the target block and the number of the target word line, which are input to the artificial neural network model.

3. The storage device of claim 1, wherein
the read level for acquiring the plurality of on-cell counts is a first read level, the on-cell count of the target block is a first on-cell count, and the plurality of on-cell counts are a plurality of first on-cell counts, and the controller is configured to,
read the memory cells connected to the plurality of reference word lines of the plurality of blocks by using a second read level to further store a plurality of second on-cell counts in the buffer memory, and
input the first on-cell count of the target block, a second on-cell count corresponding to the target block among the plurality of second on-cell counts, and the number of the target word line to the artificial neural network model to infer the plurality of read levels.

4. The storage device of claim 1, wherein the artificial neural network model includes weights and biases, the weights and biases of the artificial neural network model being calibrated based on training data.

5. The storage device of claim 4, wherein
input data of the training data comprise the plurality of on-cell counts and a plurality of numbers of a plurality of word lines of the plurality of blocks, and
output data of the training data comprise a plurality of read levels which are used to read data of memory cells connected to the plurality of word lines of the plurality of blocks.

6. The storage device of claim 1, wherein the controller is further configured to receive a request for the target word line of the target block from a host.

7. The storage device of claim 6, wherein
the target word line is a first target word line and the plurality of read levels are a plurality of first read levels, and
the controller is further configured to,
receive a request for a second target word line of the target block from the host, and
input the on-cell count of the target block and a number of the second target word line to the artificial neural network model to infer a plurality of second read levels for reading data of memory cells connected to the second target word line.

8. The storage device of claim 7, wherein the plurality of first read levels and the plurality of second read levels are different from each other.

9. The storage device of claim 1, wherein the controller is further configured to:
periodically read the memory cells connected to the plurality of reference word lines of the plurality of blocks by using the read level for acquiring the plurality of on-cell counts, and
periodically update the plurality of on-cell counts of the plurality of blocks in the buffer memory.

10. A storage device comprising:
a non-volatile memory including a plurality of blocks;
a buffer memory configured to store an artificial neural network model; and
a controller configured to:
control the non-volatile memory and the buffer memory,
read memory cells connected to reference word lines of the plurality of blocks by using first and second read levels for acquiring a plurality of first and second on-cell counts of the plurality of blocks,
store the plurality of first and second on-cell counts of the plurality of blocks in the buffer memory,
input first and second on-cell counts corresponding to a target block among the plurality of first and second on-cell counts and a number of a target word line of the target block to the artificial neural network model, and infer a plurality of read levels for reading data of memory cells connected to the target word line using the artificial neural network model.

11. The storage device of claim 10, wherein the controller is further configured to receive a request for the target word line of the target block from a host.

12. The storage device of claim 11, wherein the controller is further configured to periodically update the plurality of first and second on-cell counts of the plurality of blocks in the buffer memory after processing the request from the host.

13. The storage device of claim 12, wherein
the request from the host is a first request,
the plurality of read levels are a plurality of first read levels,
the controller is further configured to,
  receive a second request for the target word line of the target block from the host, and
  input updated first and second on-cell counts corresponding to the target block among the plurality of updated first and second on-cell counts and the number of the target word line of the target block to the artificial neural network model to infer a plurality of second read levels for reading the data of the memory cells connected to the target word line using the artificial neural network model, and
the plurality of second read levels are different from the plurality of first read levels.

14. The storage device of claim 10, wherein a number of the plurality of read levels for reading the data is greater than a number of the first and second read levels for acquiring the plurality of first and second on-cell counts.

15. A method of learning read levels to be applied to word lines of each of a plurality of blocks in a non-volatile memory of a storage device by using an artificial neural network model, the method comprising:
  reading memory cells connected to a reference word line of each of the plurality of blocks by using a read level to acquire an on-cell count of each of the plurality of blocks;
  calculating a plurality of read levels for reading data of memory cells connected to a plurality of word lines of each of the plurality of blocks;
  providing the artificial neural network model with training data, which comprise input data comprising the on-cell count of each of the plurality of blocks and numbers of the plurality of word lines and output data comprising the plurality of read levels; and
  calibrating weights and biases of the artificial neural network model such that the artificial neural network model generates the output data from the input data.

16. The method of claim 15, wherein
the reference word line is a first word line of the plurality of word lines,
the plurality of read levels comprise first read levels for reading data of memory cells connected to the first word line, and
the calibrating the weights and the biases of the artificial neural network model includes calibrating the weights and biases such that the artificial neural network model receives the on-cell count of the first word line and a number of the first word line and generates the first read levels.

17. The method of claim 16, wherein
the plurality of read levels further comprise second read levels for reading data of memory cells connected to a second word line of the plurality of word lines, and
the calibrating the weights and the biases of the artificial neural network model includes calibrating the weights and biases such that the artificial neural network model receives the on-cell count of the first word line and a number of the second word line and generates the second read levels.

18. The method of claim 15, wherein
the on-cell count is a first on-cell count,
the read level is a first read level, and
the input data further comprise a second on-cell count of each of the plurality of blocks, which is received as a result of reading the memory cells connected to the reference word line by using a second read level.

19. The method of claim 15, further comprising:
selecting one of the plurality of word lines as the reference word line depending on sums of vector-based similarities between the plurality of word lines, wherein a sum of vector-based similarities between the one of the plurality of word lines and remaining word lines among the plurality of word lines is maximum among the sums of vector-based similarities between the plurality of word lines.

20. The method of claim 15, further comprising:
providing the storage device with the artificial neural network model comprising the calibrated weights and biases.

* * * * *